(12) United States Patent
Wang et al.

(10) Patent No.: US 9,184,765 B1
(45) Date of Patent: Nov. 10, 2015

(54) POWER EFFICIENT NOISE-COUPLED DELTA-SIGMA MODULATOR

(71) Applicant: QUALCOMM Incorporated, San Diego, CA (US)

(72) Inventors: Yan Wang, San Diego, CA (US); Qubo Zhou, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/485,641

(22) Filed: Sep. 12, 2014

(51) Int. Cl.
*H03M 3/00* (2006.01)
*H03M 1/12* (2006.01)
*H04N 19/126* (2014.01)
*H03M 1/00* (2006.01)

(52) U.S. Cl.
CPC .............. *H03M 3/322* (2013.01); *H03M 3/458* (2013.01); *H03M 1/00* (2013.01); *H03M 1/12* (2013.01); *H03M 3/30* (2013.01); *H04N 7/26085* (2013.01)

(58) Field of Classification Search
CPC ........... H03M 3/30; H03M 1/00; H03M 1/12; H04N 7/26085
USPC ........................... 341/143, 155, 110, 200, 162
See application file for complete search history.

(56) References Cited

U.S. PATENT DOCUMENTS

| | | | |
|---|---|---|---|
| 5,416,483 A | 5/1995 | Matsuya | |
| 6,940,436 B2 | 9/2005 | Hezar et al. | |
| 6,970,503 B1 | 11/2005 | Kalb | |
| 8,390,494 B2 | 3/2013 | Chae et al. | |
| 8,643,524 B1 | 2/2014 | Zanbaghi | |
| 2011/0175762 A1* | 7/2011 | Chae et al. | ................ 341/143 |

* cited by examiner

*Primary Examiner* — Joseph Lauture
(74) *Attorney, Agent, or Firm* — Arent Fox LLP

(57) ABSTRACT

A method and apparatus for a feed-forward delta-sigma modulator are provided. The apparatus includes a first adder configured to receive a feedback signal and an input signal and a first integrator configured to receive an output from the first adder. The apparatus also includes a noise-coupled summer/integrator (NCSI). The NCSI includes a second adder configured to receive a differentiation path from the first integrator, an output from the first integrator, and a delayed feedback path from the output of a second integrator. The NCSI also includes the second integrator configured to receive an output from the second adder. The apparatus also includes a quantizer configured to receive the output of the second integrator, feed back the output to the first adder and the NCSI and produce the output from the feed-forward delta-sigma modulator.

20 Claims, 9 Drawing Sheets

POWER EFFICIENT NOISE-COUPLED DELTA-SIGMA MODULATOR

TECHNICAL FIELD

Various exemplary embodiments disclosed herein relate generally to electronic circuits. In particular, various embodiments relate to delta-sigma modulators.

BACKGROUND

Delta-sigma modulators are used in circuits, such as phase-locked loops, over a wide range of frequencies for functions like analog-to-digital conversion. Delta-sigma analog-to-digital converters ($\Delta\Sigma$ ADCs) are used in applications like voiceband, audio, and other high-resolution precision applications. A $\Delta\Sigma$ ADC can be used over a wide range of frequencies by using an oversampling modulator followed by a filter to produce a high-resolution data-stream output. Some advantages associated with $\Delta\Sigma$ modulators include high dynamic range and the ability to shape quantization noise out-of-band. A $\Delta\Sigma$ ADC operates by receiving an input analog signal, oversamples the signal, and accumulates the same portion over time to produce an output digital signal. A digital filter can sample the output signal of the $\Delta\Sigma$ ADC to produce a desired digital signal. Delta-sigma modulators can use switched-capacitor functional blocks, such as one or more switched-capacitor integrators and/or switched-capacitor summers.

Delta-sigma modulators can be configured to possess more advanced characteristics, such as noise shaping to reduce noise at lower frequencies. For conventional feed-forward $\Delta\Sigma$ modulators, a design that achieves Nth-order noise shaping at its output requires its circuit configuration to include N+1 operational amplifiers (op-amps). Thus, for a $\Delta\Sigma$ modulator to achieve third-order noise shaping, the circuit architecture would require use of four op-amps.

When designing power-efficient $\Delta\Sigma$ modulators, factors like size, power consumption, speed, and production costs are part of the design considerations. Depending on the desired characteristics, operational amplifiers can be major, complex components that can largely direct the cost and size of $\Delta\Sigma$ modulators used in electronic circuits.

In view of the foregoing, it would be desirable to improve design of delta-sigma modulators. In particular, it would be desirable to modify the architecture of noise-shaping $\Delta\Sigma$ modulators to more efficiently use power.

SUMMARY

In light of the present need for a power-efficient noise-shaping delta-sigma modulator, a brief summary of various exemplary embodiments is presented. Some simplifications and omissions may be made in the following summary, which is intended to highlight and introduce some aspects of the various exemplary embodiments, but not to limit the scope of the invention. Detailed descriptions of a preferred exemplary embodiment adequate to allow those of ordinary skill in the art to make and use the inventive concepts will follow in the later sections.

In an aspect, a feed-forward delta-sigma modulator apparatus is provided. The apparatus includes a first adder configured to receive a feedback signal and an input signal and a first integrator configured to receive an output from the first adder. The apparatus also includes a noise-coupled summer/integrator (NCSI). The NCSI includes a second adder configured to receive a differentiation path from the first integrator, an output from the first integrator, and a delayed feedback path from the output of a second integrator. The NCSI also includes the second integrator configured to receive an output from the second adder. The apparatus also includes a quantizer configured to receive the output of the second integrator, feed back the output to the first adder and the NCSI and produce the output from the feed-forward delta-sigma modulator.

In another aspect, a method for processing signals in a feed-forward delta-sigma modulator is provided. The method includes a first adder receiving a feedback signal and an input signal and a first integrator receiving an output from the first adder. The method also includes a second a noise-coupled summer/integrator (NCSI) receiving at a second adder a differentiation path from the first integrator, an output from the first integrator, and a delayed feedback path from the output of a second integrator. In an aspect, the second integrator receives an output from the second adder. The method also includes a quantizer receiving the output from the second integrator, feeding back the output to the first adder and the NCSI, and producing the output from the feed-forward delta-sigma modulator.

In another aspect, a feed-forward delta-sigma modulator is provided. The feed-forward delta-sigma modulator includes a first means for adding a feedback signal and an input signal and a first means for integrating an output from the first adder. The feed-forward delta-sigma modulator includes a noise-coupled means for summing and integrating. The summing and integrating means includes a second means for adding a differentiation path from the first means for integrating, and an output from the first means for integrating, and a delayed feedback path from the output of a second means for integrating. The summing and integrating means also includes the second means for integrating an output from the second means adding. The feed-forward delta-sigma modulator also includes means for quantizing the output of the second means for integrating. The quantizing means feeds back the output to the adder and the noise-coupled means for summing and integrating, and produces the output from the feed-forward delta-sigma modulator.

It should be apparent that, in this manner, various exemplary embodiments enable noise shaping using a delta-sigma modulator. Particularly, by providing noise-coupled summer/integrator, the delta-sigma modulator can provide high-order noise shaping using a minimal number of operational amplifiers during implementation.

BRIEF DESCRIPTION OF THE DRAWINGS

In order to better understand various exemplary embodiments, reference is made to the accompanying drawings wherein.

DETAILED DESCRIPTION

Figure 1:
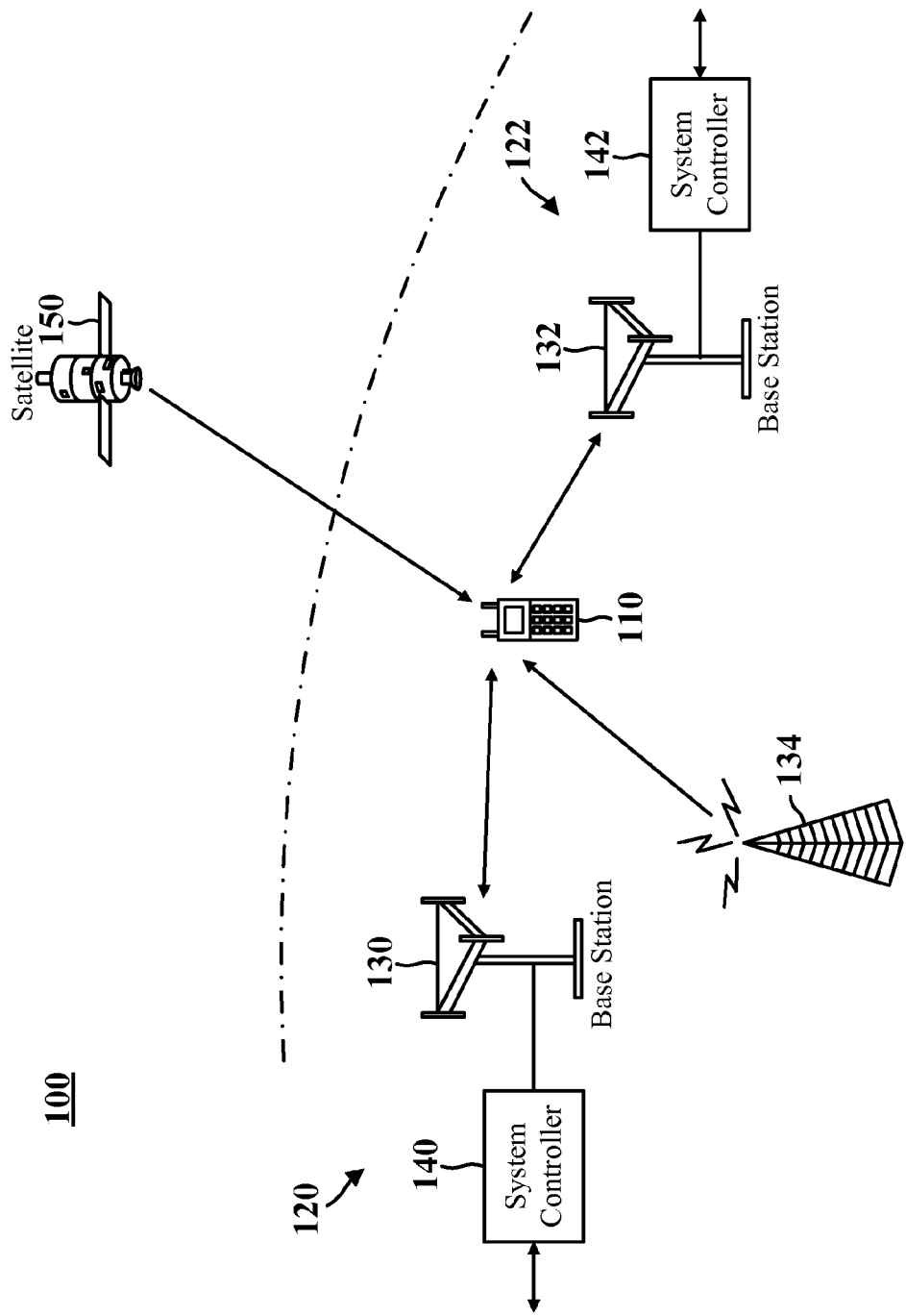
FIG. 1 illustrates a wireless device communicating with wireless communications systems.

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of various concepts. However, it will be apparent to those skilled in the art that the present invention may be practiced without these specific details. In some instances, well-known structures and components are shown in block diagram form in order to avoid obscuring such concepts. Acronyms and other descriptive terminology may be used merely for convenience and clarity and are not intended to limit the scope of the invention. The term "exemplary" is used herein to mean "serving as an example, instance, or illustration." Any design described herein as "exemplary" is not necessarily to be construed as preferred or advantageous over other designs.

Several aspects of telecommunication systems will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

Accordingly, in one or more exemplary embodiments, the functions described may be implemented in hardware, software, firmware, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise random-access memory (RAM), read-only memory (ROM), electronically erasable programmable ROM (EEPROM), compact disk (CD) ROM (CD-ROM), or other optical disk storage, magnetic disk storage or other magnetic storage devices, or any other medium that can be used to carry or store desired program code in the form of instructions or data structures and that can be accessed by a computer. Disk and disc, as used herein, includes CD, laser disc, optical disc, digital versatile disc (DVD), and floppy disk where disks usually reproduce data magnetically, while discs reproduce data optically with lasers. Combinations of the above should also be included within the scope of computer-readable media.

The word "exemplary" is used herein to mean serving as an example, instance, or illustration. Any embodiment described herein as "exemplary" is not necessarily to be construed as preferred or advantageous over other embodiments. Likewise, the term "embodiment" of an apparatus, circuit or method does not require that all embodiments of the invention include the described components, structure, features, functionality, processes, advantages, benefits, or modes of operation.

The terms "connected," "coupled," or any variant thereof, mean any connection or coupling, either direct or indirect, between two or more elements, and can encompass the presence of one or more intermediate elements between two elements that are "connected" or "coupled" together. The coupling or connection between the elements can be physical, logical, or a combination thereof. As used herein, two elements can be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Any reference to an element herein using a designation such as "first," "second," and so forth does not generally limit the quantity or order of those elements. Rather, these designations are used herein as a convenient method of distinguishing between two or more elements or instances of an element. Thus, a reference to first and second elements does not mean that only two elements can be employed, or that the first element must precede the second element.

As used herein, the terms "comprises", "comprising,", "includes" and/or "including", when used herein, specify the presence of the stated features, integers, steps, operations, elements, and/or components, but do not preclude the presence or addition of one or more other features, integers, steps, operations, elements, components, and/or groups thereof.

Various aspects of circuits for a power-efficient noise-coupled delta-sigma modulator will now be presented. However, as those skilled in the art will readily appreciate, such aspects may be extended to other circuit configurations and devices. Accordingly, all references to a specific application for delta-sigma modulators, or any component, structure, feature, functionality, or process within a wireless device are intended only to illustrate exemplary aspects of electronic hardware with the understanding that such aspects may have a wide differential of applications.

Various embodiments of hardware with an installed frequency divider may be used, such as a mobile phone, personal digital assistant (PDA), desktop computer, laptop computer, palm-sized computer, tablet computer, set-top box, navigation device, work station, game console, media player, or any other suitable device.

FIG. 1 illustrates a wireless device communicating with different wireless communications systems. FIG. 1 is a diagram 100 illustrating a wireless device 110 communicating with different wireless communication systems 120, 122. Wireless device 110 can use a VCO, for example, for communications via carrier waves at specified frequencies via techniques like phase modulation; other uses of VCOs in electronic hardware are known to those of skill in the art.

Wireless systems 120, 122 may each be a Code Division Multiple Access (CDMA) system, a Global System for Mobile Communications (GSM) system, a Long Term Evolution (LTE) system, a wireless local area network (WLAN) system, or some other wireless system. A CDMA system may implement Wideband CDMA (WCDMA), CDMA 1X or cdma2000, Time Division Synchronous Code Division Multiple Access (TD-SCDMA), or some other version of CDMA. TD-SCDMA is also referred to as Universal Terrestrial Radio Access (UTRA) Time Division Duplex (TDD) 1.28 Mcps Option or Low Chip Rate (LCR). LTE supports both frequency division duplexing (FDD) and time division duplexing (TDD). For example, wireless system 120 may be a GSM system, and the wireless system 122 may be a WCDMA system. As another example, the wireless system 120 may be an LTE system, and wireless system 122 may be a CDMA system.

For simplicity, diagram 100 shows wireless system 120 including one base station 130 and one system controller 140, and wireless system 122 including one base station 132 and one system controller 142. In general, each wireless system 120, 122 may include any number of base stations and any set of network entities. Each base station 130, 132 may support communication for wireless devices within the coverage of the base station. Base stations 130, 132 may also be referred to as a Node B, an evolved Node B (eNB), an access point, a base transceiver station, a radio base station, a radio transceiver, a transceiver function, a basic service set (BSS), an extended service set (ESS), or some other suitable terminology. Wireless device 110 may also be referred to as a user equipment (UE), a mobile device, a remote device, a wireless device, a wireless communications device, a station, a mobile station, a subscriber station, a mobile subscriber station, a terminal, a mobile terminal, a remote terminal, a wireless terminal, an access terminal, a client, a mobile client, a mobile unit, a subscriber unit, a wireless unit, a remote unit, a handset, a user agent, or some other suitable terminology. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, or some other similar functioning device.

Wireless device 110 may be capable of communicating with wireless system 120 and/or 122. Wireless device 110 may also be capable of receiving signals from broadcast stations, such as broadcast station 134. Wireless device 110 may also be capable of receiving signals from satellites, such as satellite 150, in one or more global navigation satellite systems (GNSS). Wireless device 110 may support one or more radio technologies for wireless communication such as GSM, WCDMA, cdma2000, LTE, 802.11, etc. The terms "radio technology," "radio access technology," "air interface," and "standard" may be used interchangeably.

Wireless device 110 may communicate with a base station in a wireless system via the downlink and the uplink. The downlink (or forward link) refers to the communication link from the base station to the wireless device, and the uplink (or reverse link) refers to the communication link from the wireless device to the base station. A wireless system may utilize TDD and/or FDD. For TDD, the downlink and the uplink may share the same frequency, and downlink transmissions and uplink transmissions may be sent on the same frequency in different time periods. For FDD, the downlink and the uplink are allocated separate frequencies. Downlink transmissions may be sent on one frequency, and uplink transmissions may be sent on another frequency. Some exemplary radio technologies supporting TDD include GSM, LTE, and TD-SCDMA. Some exemplary radio technologies supporting FDD include WCDMA, cdma2000, and LTE.

Figure 2:
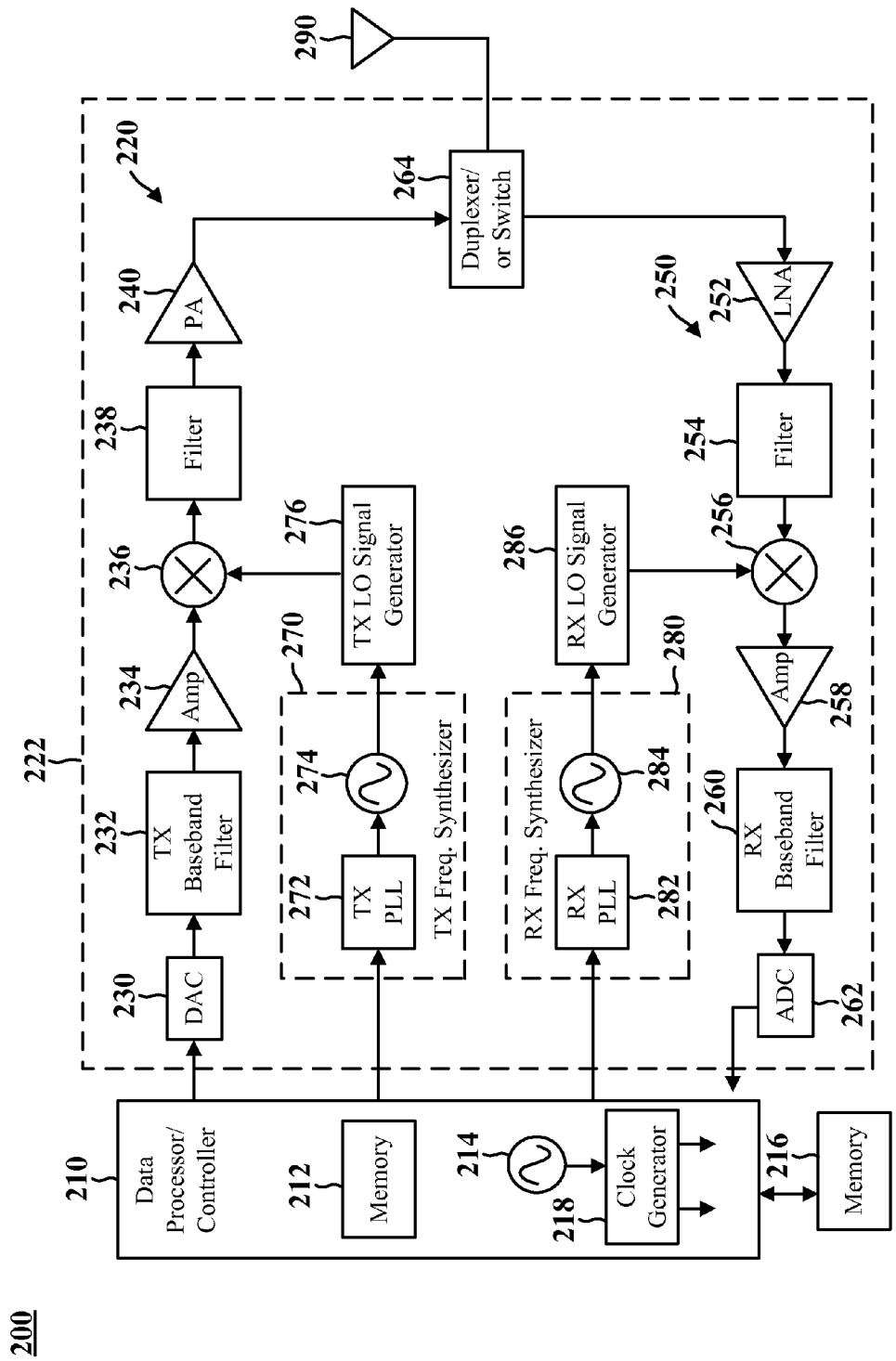
FIG. 2 illustrates a block diagram of a wireless device.

FIG. 2 is a block diagram 200 of an exemplary wireless device, such as the wireless device 110. The wireless device includes a data processor/controller 210, a transceiver 222, and an antenna 290. The data processor/controller 210 may be referred to as a processing system. A processing system may include the data processor/controller 210 or both the data processor/controller 210 and the memory 216. The transceiver 222 includes a transmitter 220 and a receiver 250 that support bi-directional communication. The transmitter 220 and/or the receiver 250 may be implemented with a super-heterodyne architecture or a direct-conversion architecture. In the super-heterodyne architecture, a signal is frequency converted between RF and baseband in multiple stages, e.g., from RF to an intermediate frequency (IF) in one stage, and then from IF to baseband in another stage for a receiver. In the direct-conversion architecture, which is also referred to as a zero-IF architecture, a signal is frequency converted between RF and baseband in one stage. The super-heterodyne and direct-conversion architectures may use different circuit blocks and/or have different requirements. In the exemplary design shown in FIG. 2, the transmitter 220 and the receiver 250 are implemented with the direct-conversion architecture.

In the transmit path, the data processor/controller 210 may process (e.g., encode and modulate) data to be transmitted and provide the data to a digital-to-analog converter (DAC) 230. The DAC 230 converts a digital input signal to an analog output signal. The analog output signal is provided to a transmit (TX) baseband (lowpass) filter 232, which may filter the analog output signal to remove images caused by the prior digital-to-analog conversion by the DAC 230. An amplifier (amp) 234 may amplify the signal from the TX baseband filter 232 and provide an amplified baseband signal. An upconverter (mixer) 236 may receive the amplified baseband signal and a TX LO signal from a TX LO signal generator 276. The upconverter 236 may upconvert the amplified baseband signal with the TX LO signal and provide an upconverted signal. A filter 238 may filter the upconverted signal to remove images caused by the frequency upconversion. A power amplifier (PA) 240 may amplify the filtered RF signal from the filter 238 to obtain the desired output power level and provide an output RF signal. The output RF signal may be routed through a duplexer/switchplexer 264.

For FDD, the transmitter 220 and the receiver 250 may be coupled to the duplexer 264, which may include a TX filter for the transmitter 220 and a receive (RX) filter for the receiver 250. The TX filter may filter the output RF signal to pass signal components in a transmit band and attenuate signal components in a receive band. For TDD, the transmitter 220 and the receiver 250 may be coupled to switchplexer 264. The switchplexer 264 may pass the output RF signal from the transmitter 220 to the antenna 290 during uplink time intervals. For both FDD and TDD, the duplexer/switchplexer 264 may provide the output RF signal to the antenna 290 for transmission via a wireless channel.

In the receive path, the antenna 290 may receive signals transmitted by base stations and/or other transmitter stations and may provide a received RF signal. The received RF signal may be routed through duplexer/switchplexer 264. For FDD, the RX filter within the duplexer 264 may filter the received RF signal to pass signal components in a receive band and attenuate signal components in the transmit band. For TDD, the switchplexer 264 may pass the received RF signal from the antenna 290 to the receiver 250 during downlink time intervals. For both FDD and TDD, the duplexer/switchplexer 264 may provide the received RF signal to the receiver 250.

Within the receiver 250, the received RF signal may be amplified by a low noise amplifier (LNA) 252 and filtered by a filter 254 to obtain an input RF signal. A downconverter (mixer) 256 may receive the input RF signal and an RX LO signal from an RX LO signal generator 286. The downconverter 256 may downconvert the input RF signal with the RX LO signal and provide a downconverted signal. The downconverted signal may be amplified by an amplifier 258 and further filtered by an RX baseband (lowpass) filter 260 to obtain an analog input signal. The analog input signal is provided to an analog-to-digital converter (ADC) 262. The ADC 262 converts an analog input signal to a digital output signal. The digital output signal is provided to the data processor/controller 210.

A TX frequency synthesizer 270 may include a TX phase locked loop (PLL) 272 and a VCO 274. The VCO 274 may generate a TX VCO signal at a desired frequency. The TX PLL 272 may receive timing information from the data processor/controller 210 and generate a control signal for the VCO 274. The control signal may adjust the frequency and/or the phase of the VCO 274 to obtain the desired frequency for the TX VCO signal. The TX frequency synthesizer 270 provides the TX VCO signal to the TX LO signal generator 276. The TX LO signal generator may generate a TX LO signal based on the TX VCO signal received from the TX frequency synthesizer 270.

A RX frequency synthesizer 280 may include an RX PLL 282 and a VCO 284. The VCO 284 may generate an RX VCO signal at a desired frequency. The RX PLL 282 may receive timing information from the data processor/controller 210 and generate a control signal for the VCO 284. The control signal may adjust the frequency and/or the phase of the VCO 284 to obtain the desired frequency for the RX VCO signal. The RX frequency synthesizer 280 provides the RX VCO signal to the RX LO signal generator 286. The RX LO signal generator may generate an RX LO signal based on the RX VCO signal received from the RX frequency synthesizer 280.

The LO signal generators 276, 286 may each include frequency dividers, buffers, etc. The LO signal generators 276, 286 may be referred to as frequency dividers if they divide a frequency provided by the TX frequency synthesizer 270 and the RX frequency synthesizer 280, respectively. The PLLs 272, 282 may each include a phase/frequency detector, a loop filter, a charge pump, a frequency divider, etc. Each VCO signal and each LO signal may be a periodic signal with a particular fundamental frequency. The TX LO signal and the RX LO signal from the LO generators 276, 286 may have the same frequency for TDD or different frequencies for FDD. The TX VCO signal and the RX VCO signal from the VCOs 274, 284 may have the same frequency (e.g., for TDD) or different frequencies (e.g., for FDD or TDD).

The conditioning of the signals in the transmitter 220 and the receiver 250 may be performed by one or more stages of amplifier, filter, upconverter, downconverter, etc. These circuits may be arranged differently from the configuration shown in FIG. 2. Furthermore, other circuits not shown in FIG. 2 may also be used to condition the signals in the transmitter 220 and the receiver 250. For example, impedance matching circuits may be located at the output of the PA 240, at the input of the LNA 252, between the antenna 290 and the duplexer/switchplexer 264, etc. Some circuits in FIG. 2 may also be omitted. For example, the filter 238 and/or the filter 254 may be omitted. All or a portion of the transceiver 222 may be implemented on one or more analog integrated circuits (ICs), RF ICs (RFICs), mixed-signal ICs, etc. For example, the TX baseband filter 232 to the PA 240 in the transmitter 220, the LNA 252 to the RX baseband filter 260 in the receiver 250, the PLLs 272, 282, the VCOs 274, 284, and the LO signal generators 276, 286 may be implemented on an RFIC. The PA 240 and possibly other circuits may also be implemented on a separate IC or a circuit module.

The data processor/controller 210 may perform various functions for the wireless device. For example, the data processor/controller 210 may perform processing for data being transmitted via the transmitter 220 and received via the receiver 250. The data processor/controller 210 may control the operation of various circuits within the transmitter 220 and the receiver 250. The memory 212 and/or the memory 216 may store program codes and data for the data processor/controller 210. The memory may be internal to the data processor/controller 210 (e.g., the memory 212) or external to the data processor/controller 210 (e.g., the memory 216). The memory may be referred to as a computer-readable medium. An oscillator 214 may generate a VCO signal at a particular frequency. A clock generator 218 may receive the VCO signal from the oscillator 214 and may generate clock signals for various modules within the data processor/controller 210. The data processor/controller 210 may be implemented on one or more application specific integrated circuits (ASICs) and/or other ICs.

Figure 3:
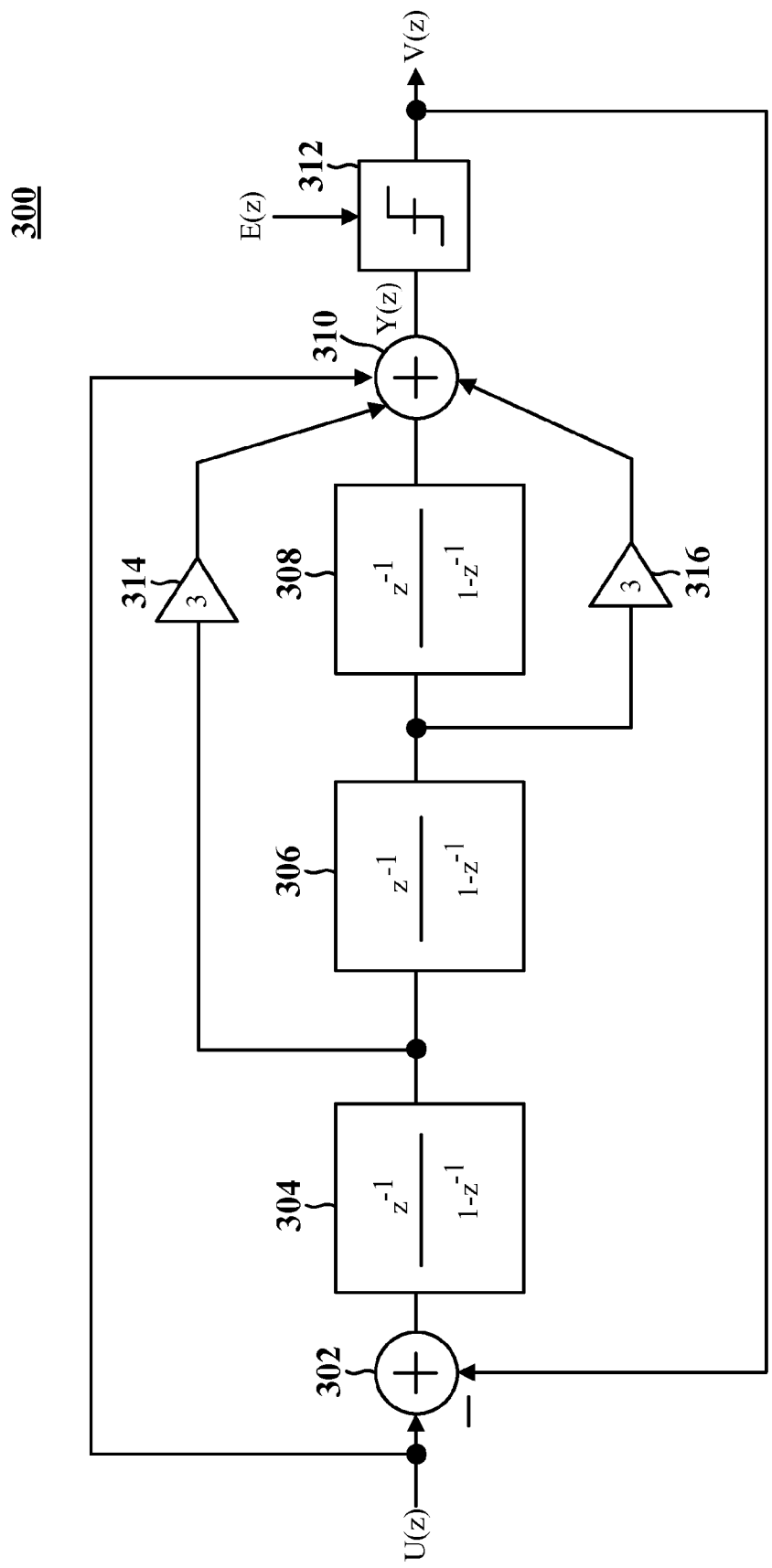
FIG. 3 illustrates a conventional feed-forward delta-sigma modulator.

FIG. 3 illustrates a conventional feed-forward delta-sigma modulator. Delta-sigma modulator 300 is shown using its frequency-domain functional blocks. The modulator can be constructed using components that can, for example, operate in the time domain. Delta-sigma modulator 300 can be used, for example, as analog-to-digital converter (ADC) 262 in RX chain 250. In some embodiments, $\Delta\Sigma$ modulator 300 can be a component of TX PLL 272 and/or RX PLL 282. Delta-sigma modulator 300 can include adders 302, 310, integrators 304, 306, 308, quantizer 312, and feed-forward paths 314, 316.

In operation, $\Delta\Sigma$ modulator 300 receives an analog input signal $U(z)$ and generates an output $V(z)$ produced from quantizer 312. Adder 310 receives a feed-forward paths from input $U(z)$ and the outputs of integrators 304, 306, 308, to produce an analog output $Y(z)$. Quantizer 312 can produce digital output $V(z)$ based on analog output $Y(z)$. During quantization, quantizer 312 can add a non-negligible amount of quantization noise $E(z)$ that can be shaped so it is no longer part of the output signal. In the illustrative embodiment for example, the output of the quantizer 312 is sent back as negative feedback to adder 302. As the quantization noise passes through each integrator 304, 306, 308, the quantization noise is shifted to higher frequencies, out of the desired passband used for sampling.

Feed-forward $\Delta\Sigma$ modulator 300 can achieve higher-order noise-shaping through its cascade of integrators 304-308. In the illustrative embodiment, for example, $\Delta\Sigma$ modulator 300 achieves third-order noise shaping through its use of three integrators so that the ideal quantization noise output takes a third-order shape. This can be generalized such that Nth-order noise shaping is achieved using N (where $N \geq 1$) integrators. In some embodiments, $\Delta\Sigma$ modulator 300 can be configured for Nth-order noise shaping using N integrators, such as when $N \geq 1$, $2 \leq N \leq 6$, and as in the illustrative embodiment, where $N=3$.

In a similar manner, $\Delta\Sigma$ modulator 300 achieves third-order noise shaping while using four operational amplifiers (one op-amp for each of the three integrators, in addition to one op-amp for adder 310). This relationship can be generalized such that a ΔΣ modulator 300 using similar topology can achieve Nth-order noise shaping through the use of N+1 operational amplifiers.

It should be noted that the "3" indicated at blocks 314, 316 refer to the gain factor in each respective feed-forward path. For example, scaled feed-forward paths 314, 316 increase the signal by a gain of 3. Different embodiments can include different gains on one or more of the feed-forward paths. In some embodiments, the value of the gain can be based on the order of noise shaping used by the modulator. For example, a ΔΣ modulator achieving fourth-order noise shaping may have different values as gain factors in one or more feed-forward paths.

Figure 4:
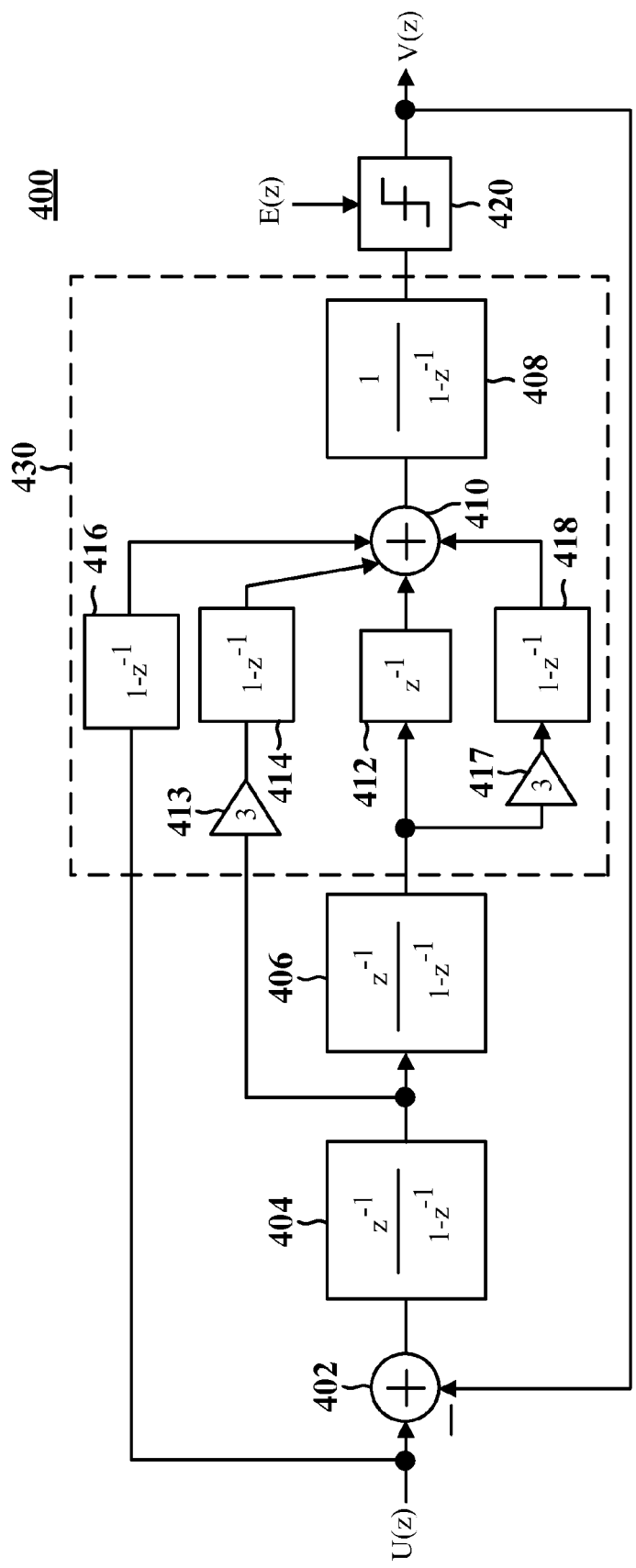
FIG. 4 illustrates a conventional feed-forward delta-sigma modulator that includes a combined integrator.

FIG. 4 illustrates a conventional feed-forward delta-sigma modulator that includes a combined integrator. Delta-sigma modulator 400 is similar to ΔΣ modulator 300 and can include similar components, including adder 402, integrators 404, 406, and quantizer 420. Delta-sigma modulator 400 can similarly achieve third-order noise shaping in its output.

However, ΔΣ modulator 400 includes a combined integrator 430 that combines summer 310 and integrator 308. Combined integrator 430 includes an integrator 408, a summer 410, delay path 412, scaled feed-forward gains 413, 417, and differentiation paths 414, 416, and 418. Combined integrator 430 uses a single op-amp to perform the summing function to combine the feed-forward paths 413-418 and delay path 412, as well as the integrating function at 408. Compared to ΔΣ modulator 300, ΔΣ modulator 400 uses fewer amplifiers, such that ΔΣ modulator 400 achieves Nth-order noise shaping while only using N op-amps.

Figure 5:
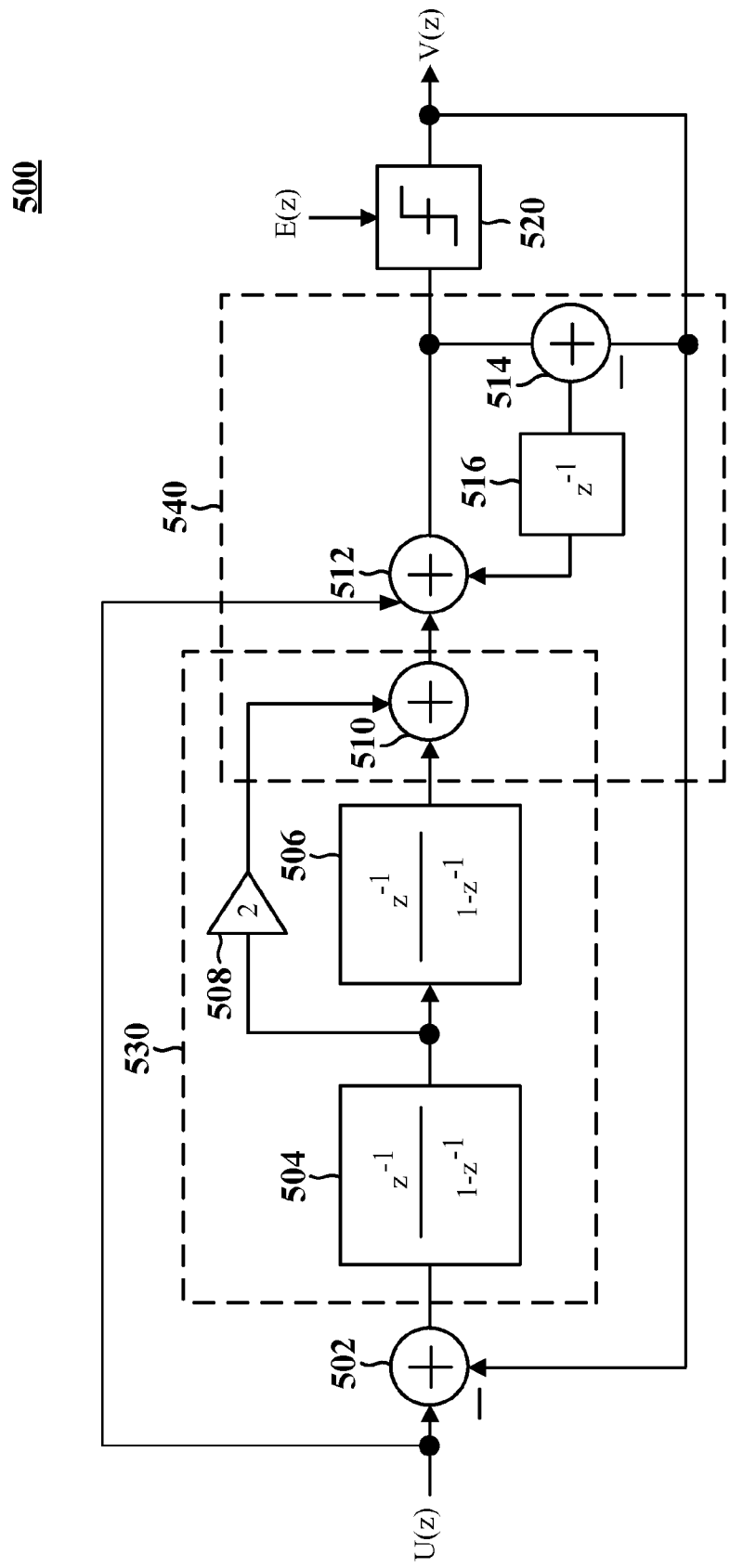
FIG. 5 illustrates a conventional feed-forward delta-sigma modulator that includes a noise-coupled summer.

FIG. 5 illustrates a conventional feed-forward delta-sigma modulator that includes a noise-coupled summer. Delta-sigma modulator 500 is similar to ΔΣ modulator 300 and can include frequency-domain functional blocks, such as adder 502, quantizer 520, analog loop filter 530, and noise-coupled summer 540. Analog loop filter 530 can be a functional block that includes one or more integrators 504, 506 based on the order of noise shaping desired. Analog filter 530 also includes feed-forward path 508 and adder 510. Noise-coupled summer 540 can include adders 510, 512, 514, and delay path 516. In some embodiments, adders 510, 512 can be combined such that a single adder 512 additionally receives feed-forward paths from the outputs of integrators 504, 506.

During operation, noise-coupled summer 540 can extract the quantization noise from the output signal at adder 514 and feed back the noise component to the loop filter output. This feedback of the noise back to the filter has the same effect as processing the noise through an integrator such that noise-coupled summer 540 achieves a first-order noise-shaping enhancement. In the illustrative embodiment, for example, ΔΣ modulator 500 achieves third-order noise shaping by achieving second-order noise shaping from integrators 504, 506 and a first-order noise shaping through noise-coupled summer 540.

Noise-coupled summer 540 can link the feedback component to the op-amp used for summer 512 such that noise-coupled summer 540 uses a single op-amp. As a result, ΔΣ modulator 500 can achieve Nth-order noise shaping using N op-amps: one for each of N−1 integrators, and one used in noise-coupled summer 540.

Figure 6:
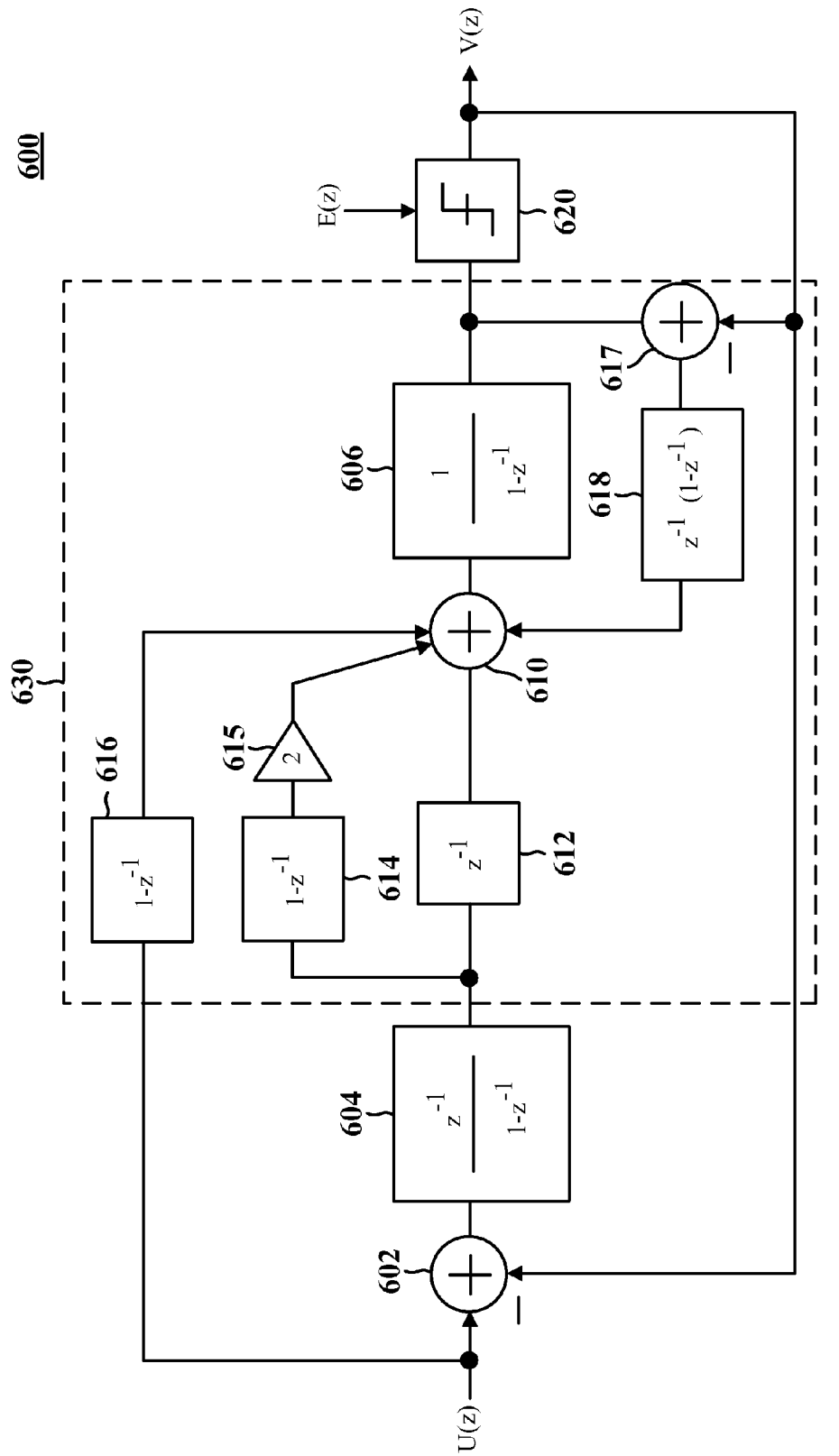
FIG. 6 illustrates a feed-forward delta-sigma modulator that includes a noise-coupled summer and integrator.

FIG. 6 illustrates a feed-forward delta-sigma modulator that includes a noise-coupled summer and integrator. Delta-sigma modulator 600 is similar to ΔΣ modulators 300, 400, 500 and includes similar frequency-domain functional components for analog signals. Delta-sigma modulator 600 includes an adder 602, an integrator 604, a quantizer 620, and a noise-coupled summer/integrator (NCSI) 630. NCSI 630 can include an integrator 606, a summer 610, a subtractor 617, delay path 612, feed-forward paths 614-616, and delayed feedback path 618.

NCSI 630 includes adder/summer 610 that receives inputs from feed-forward paths 614-616. This can include differentiation path 616 from the input, differentiation path 614 from the output of integrator 604, and delay path 612 from integrator 604. In some embodiments, one or more feed-forward paths can include gains in the signal. In the illustrative embodiment, for example, differentiation path 614 includes gain factor 615. In some embodiments, adder 610 can receive additional feed-forward paths from additional integrators placed between integrator 604 and NCSI 630. These additional integrators can be used by ΔΣ modulator 600 to achieve higher-order noise shaping. This can be generalized such that ΔΣ modulator 600 can achieve Nth-order noise shaping by including N−3 integrators between integrator 604 and NCSI 630. In the illustrative embodiment, for example, ΔΣ modulator 600 can achieve third-order noise shaping using zero integrators between integrator 604 and NCSI 630.

NCSI 630 includes a delayed feedback path 618 from the output of subtractor 617. Unlike noise-coupled summer 530 of ΔΣ modulator 500, NCSI includes an integrator that modifies the output of adder 610. As a result, the quantization noise extracted by subtractor 617 is not at the same state as the other values received by adder 610. As a result, delayed feedback path 618 extracts the quantization noise from the output of integrator 606. Delayed feedback path 618 allows the output of adder 610 to be noise-coupled and adds an extra order to the noise-shaped output of NCSI. In the illustrative embodiment, for example, NCSI 630 achieves second-order noise shaping due to integrator 606 and adder 610 being noise-coupled through delayed feedback path 618. NCSI 630 can include a single operation amplifier that is used for both integrator 606 and summer 610.

Figure 7:
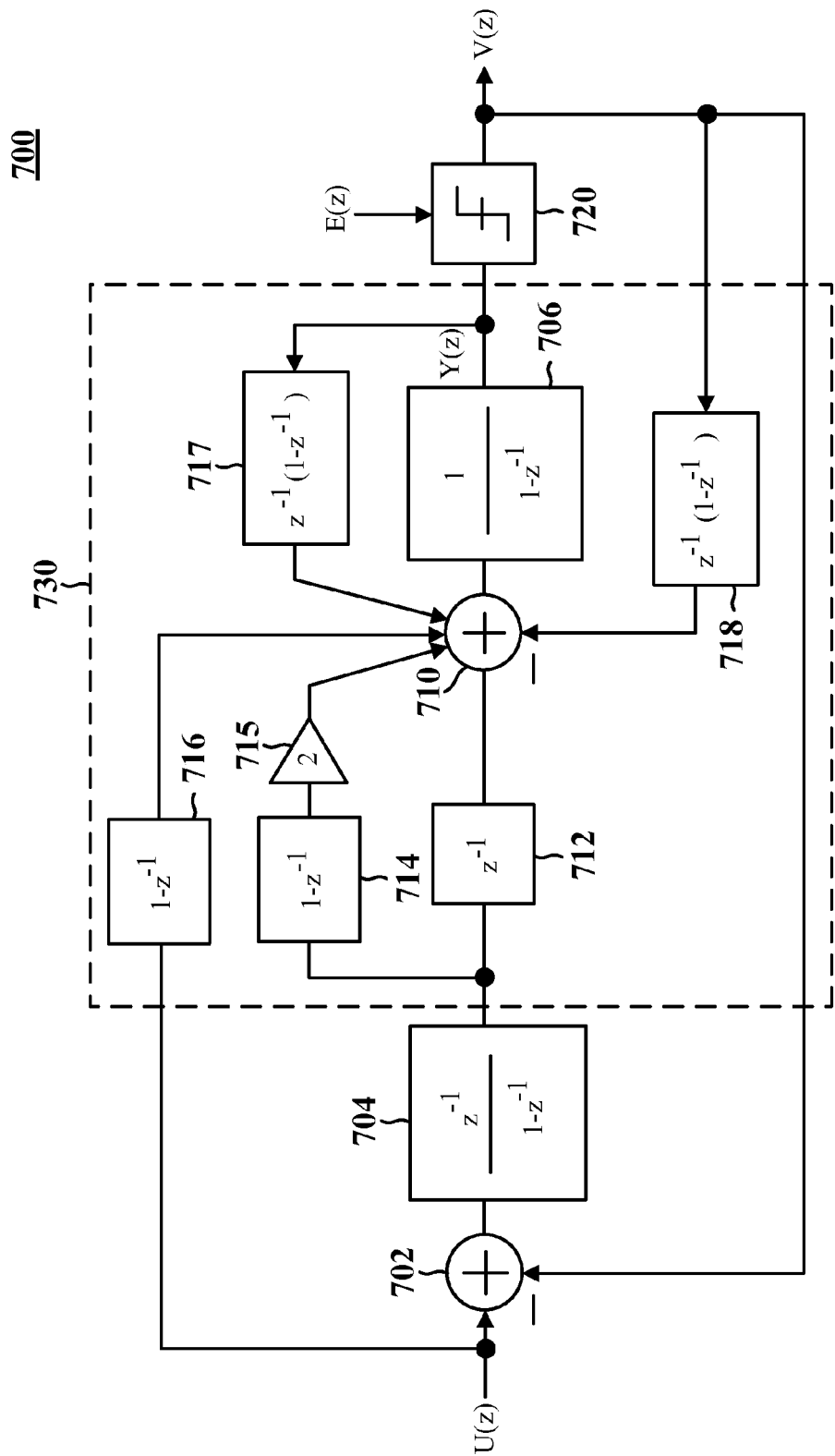
FIG. 7 illustrates another embodiment of a feed-forward delta-sigma modulator that includes a noise-coupled summer and integrator.

FIG. 7 illustrates another embodiment of a feed-forward delta-sigma modulator that includes a noise-coupled summer and integrator. Delta-sigma modulator 700 is similar to ΔΣ modulator 600 and similarly includes an adder 702, an integrator 704, a quantizer 720, and a noise-coupled summer/integrator (NCSI) 730. NCSI similarly includes an integrator 706, an adder/subtractor 710, delay path 712, and feed-forward paths 714-716. NCSI also includes feedback delay paths 717, 718.

NCSI 730 functions in a similar manner to NCSI 630, as adder 710 can combine the feed-forward and delay paths 712-716 to provide noise-modulation from the preceding integrator 704. Adder/subtractor 710 can also include higher-order noise shaping by including the delayed integrated output of integrator 706 and delayed output from quantizer 720 that includes the quantization noise, which adder/subtractor 710 subtracts before producing its output. Delayed feedback paths 717-718 can therefore be equivalent to the value included in delayed feedback path 618 in NCSI 630. NCSI 730 can, however, produce this result without using an additional subtractor 617, using a single adder/subtractor 710 to perform all the signal combination functions within NCSI 730.

As will be discussed in greater detail in relation to FIG. 8, NCSI 730 can therefore include a single operational amplifier that is used for both integrator 706 and summer 710. Accordingly, NCSI 730 can be designed such that it is implemented using only one op-amp. As a result, ΔΣ modulator 700 using NCSI 730 can achieve Nth-order noise-shaping while using N−1 op-amps: one op-amp for each integrator before NCSI 730 (which would provide noise-shaping at the order of N−2), and a single op-amp in NCSI 730 to provide second-order noise shaping.

Figure 8:
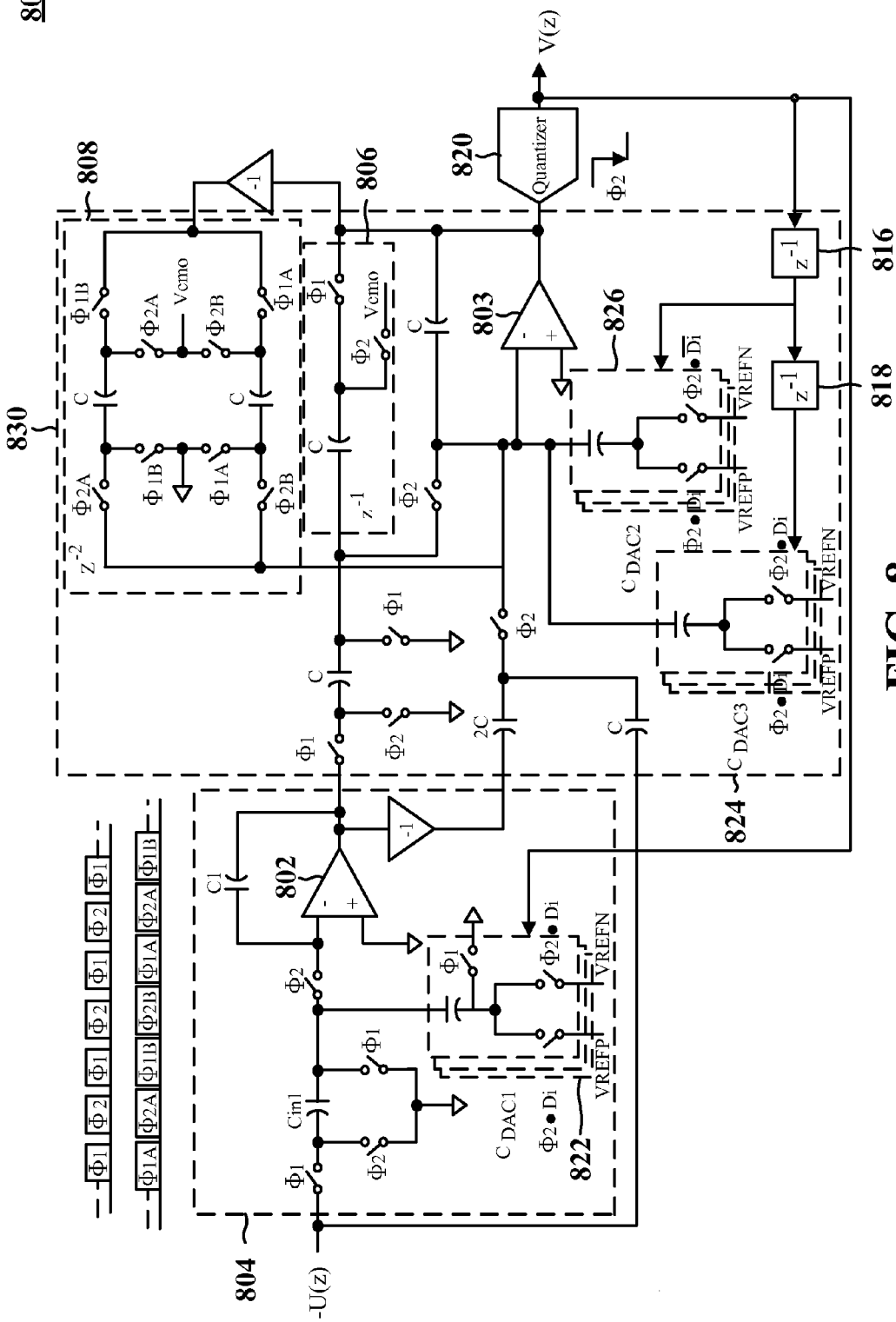
FIG. 8 illustrates a circuit implementation of a feed-forward delta-sigma modulator that includes a noise-coupled summer and integrator.

FIG. 8 illustrates a circuit implementation of a feed-forward delta-sigma modulator that includes a noise-coupled summer and integrator. Delta-Sigma modulator 800 can be a circuit implementation of ΔΣ modulator 700 and includes time-domain modulation of an input analog signal to produce a noise-shaped result. The illustrative embodiment, for example, produces a third-order noise-shaped digital output signal V(z) from quantizer 820 based on analog input signal U(z). Delta-sigma modulator 800 includes integrator 804, quantizer 820, and noise-coupled summer/integrator (NCSI) 830. Integrator 804 includes op-amp 802 and digital-to-analog converter (DAC) 822. NCSI 830 includes op-amp 803, analog delay circuits 806, 808, digital delay circuits 816, 818, and DACs 824, 826.

Delta-sigma modulator 800 includes a plurality of switches that close based on the phase of a controlling clock signal. In the illustrative embodiment, for example, switches with a "Φ$_1$" symbol close at clock phase Φ$_1$. Quantizer 820 can produce an output on the falling edge of a clock phase. For example, quantizer 820 can produce a digital output at the falling edge of clock phase Φ$_2$. Similarly, specific paths may operate based on specific clock phases and delays within the circuit. For example, there is one clock cycle delay between the end of the sampling done by quantizer 820 and the end of integration done by operational amplifiers 802, 803.

Delta-sigma modulator 800 can be implemented such that certain frequency-domain components like adder 702 are implemented without using op-amps; rather, the same functionality is achieved through connections via timed switches. For example, an adder function is included within integrator 804, were the input signal and the converted output signal (via DAC 822) are combined at the negative input of op-amp 802. DACs 822, 824, 826 can be single or multi-bit converters that convert the output digital signal generated by quantizer 820 into an analog signal used by other components in integrator 803 and NCSI 830, respectively.

Feed-forward paths 714-716 can be implemented via connections between integrator 804 and NCSI 830 at specific clock phases. For example, feed-forward paths 714-716 are connected to the input of the summer in NCSI 830 via capacitors before a Φ$_2$ switch. The size of these capacitors can be modified to reflect the gain in each feed-forward path. For example, the 2C capacitor reflects the gain factor 715. In other embodiments, feed-forward path 714 and other feed-forward paths can be configured to have different gains inputting into summer 710.

Delay circuits 806, 808, 816, 818 can include analog $z^{-1}$ circuit 806, digital $z^{-1}$ circuits 816, 818 and analog $z^{-2}$ circuit 808. Analog delay circuits 806, 808 can operate to function like delayed feedback path 717. Digital delay circuits 816, 818 can be implemented using digital flip-flops (DFFs) and can operate to function like delayed feedback path 718, delaying the digital output signal by one (by circuit 816) or two (by a cascade of circuits 816, 818) clock cycles. The feed-forward paths are all connected to input of op-amp 803, which serves as the summer for NCSI 830. Op-amp 803 can also alternate its function to act as integrator from its function as a summer, depending on the path in operation.

As the illustrative embodiment shows, ΔΣ modulator 800 can achieve third-order noise-shaping while using the two operational amplifiers 802-803. Additional integrators (using circuit implementations similar to integrator 804) can be configured to operate between integrator 804 and NCSI 830 to achieve higher-order noise shaping for digital output at V(z).

Figure 9:
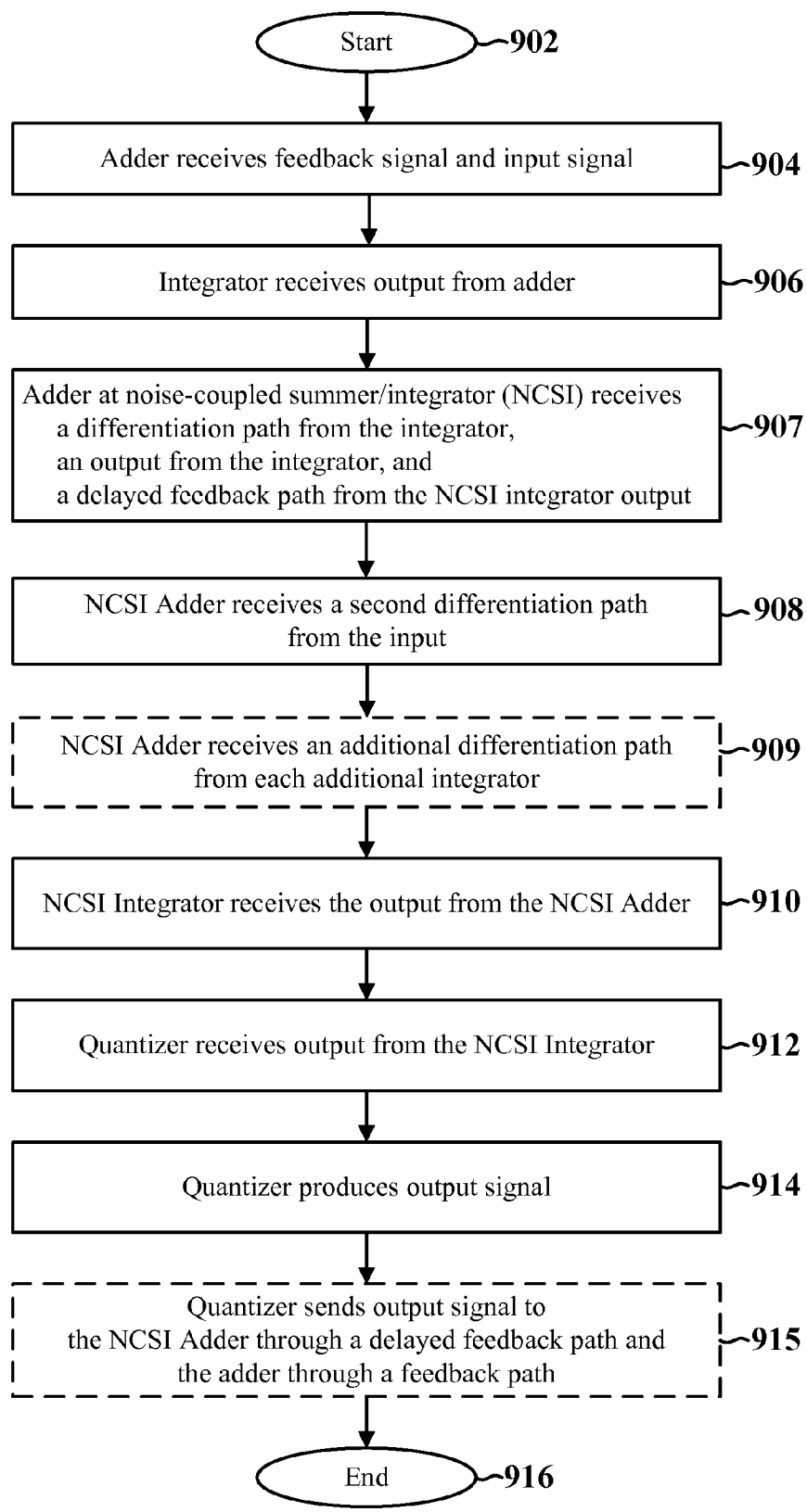
FIG. 9 illustrates an exemplary method for processing signals using a feed-forward delta-sigma modulator including a noise-coupled summer and integrator.

FIG. 9 illustrates an exemplary method for processing signals using a feed-forward delta-sigma modulator including a noise-coupled summer and integrator. Modulator 600, 700, 800 can implement method 900, for example in order to produce a digital output from an input analog signal.

Method 900 begins at step 902 and proceeds to step 904, where adder 702 receives an input signal U(z) and a feedback signal from quantizer 720. In some embodiments, the feedback signal is a converted analog signal received from a DAC in the feedback path. In some embodiments, the feedback signal may be the output signal V(z).

In step 906, integrator 704 can receive the output of adder 702. In some embodiments, the output of adder/subtractor 702 can be a signed quantity of the quantization noise. In some embodiments, adder/subtractor 702 can output an absolute value of the quantization noise.

In step 907, adder 710 in noise-coupled summer/integrator (NCSI) 730 can receive multiple input signals. These input signals can include a differentiation path 714 from integrator 704, a delay path 712 from output of the integrator 704, and a delayed feedback path 717 from the output of integrator 706. In some embodiments, a feed-forward path can include the a gain factor, such as gain factor 715 for differentiation path 714.

In an aspect, modulator 600, 700, 800 can include a second differentiation path 716 from the input U(z). In such instances, adder 710 in NCSI 730 can, in step 908, receive the second differentiation path 716. In another aspect, modulator 600, 700, 800 can include additional integrators between integrator 704 and NCSI 730. In such instances, adder 710 can in step 909 receive an additional differentiation path from the output of each additional integrator.

In step 910, integrator 706 receives the output of summer 710. In some embodiments, the output of summer 710 can include a noise-shaped signal that shifted the quantization noise E(z) to higher frequencies, out of the expected passband used in quantizer 720.

In step 912, quantizer 720 receives the output of integrator 706. In some embodiments, the output signal of integrator 706 is an analog signal that includes quantization noise shaped to the Nth order. In FIG. 7, for example, integrator 706 can output an analog signal Y(z) that includes third-order shaped quantization noise, with a vast majority of the quantization noise being at frequencies outside of the passband used in quantizer 720.

In step 914, quantizer 720 can produce an output signal based on the input signal Y(z) received from integrator 706 at step 912. In some embodiments, quantizer 720 can include a passband that converts the analog signal within the passband to a digital symbol or signal. In some embodiments, quantizer 720 can inject a non-negligible amount of quantization noise E(z) when producing the digital signal. In some embodiments, quantizer 720 can, in step 915, also send the output V(z) to summer 710 via a delayed feedback path 718 and to adder 702. In such embodiments, a DAC on the feedback path can convert the output signal from a digital signal to an analog signal.

Through feedback and noise shaping, over time, the output signal V(z) produced by quantizer 720 includes little quantization noise, as a majority of the quantization noise has been shaped out of the passband used in quantizer 720. Once quantizer produces the output signal V(z), the method can end at step 916.

It is understood that the specific order or hierarchy of steps in the processes/flow charts disclosed is an illustration of exemplary approaches. Based upon design preferences, it is understood that the specific order or hierarchy of steps in the processes/flow charts may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

We claim:

1. A feed-forward delta-sigma modulator, comprising:
   a first adder configured to receive a feedback signal and an input signal;
   a first integrator configured to receive an output from the first adder;
   a noise-coupled summer/integrator (NCSI) comprising:
      a second adder configured to receive:
         a differentiation path from the first integrator,
         an output from the first integrator, and
         a delayed feedback path from the output of a second integrator, and
      the second integrator configured to receive an output from the second adder; and
   a quantizer configured to:
      receive the output of the second integrator,
      feed back the output to the first adder and the NCSI, and
      produce the output from the feed-forward delta-sigma modulator.

2. The feed-forward delta-sigma modulator of claim 1, wherein the second adder subtracts the output received through a feedback path from the quantizer.

3. The feed-forward delta-sigma modulator of claim 1, wherein the output of the second integrator comprises a third-order noise-shaped analog signal.

4. The feed-forward delta-sigma modulator of claim 1, further comprising:
   a second differentiation path from the input signal.

5. The feed-forward delta-sigma modulator of claim 1, further comprising:
   a plurality of N integrators between the first integrator and the NCSI, wherein the output of the second integrator comprises an (N+3)-order noise-shaped analog signal.

6. The feed-forward delta-sigma modulator of claim 1, further comprising:
   a third integrator configured to receive the output from the first integrator and provide an output to the NCSI,
   wherein the second adder in the NCSI receives the output of the third integrator instead of the output from the first integrator and
   further wherein the output of the second integrator comprises a fourth-order noise-shaped output signal.

7. The feed-forward delta-sigma modulator of claim 6, further comprising:
   a second differentiation path from the output of the third integrator, wherein the second adder receives the second differentiation path.

8. The feed-forward delta-sigma modulator of claim 7, further comprising:
   a third differentiation path from the input.

9. A method for processing signals in a feed-forward delta-sigma modulator, comprising:
   receiving a feedback signal and an input signal at a first adder;
   receiving an output from the first adder at a first integrator;
   receiving, at a noise-coupled summer/integrator (NCSI):
      a differentiation path from the first integrator at a second adder,
      an output from the first integrator at the second adder,
      a delayed feedback path from the output of a second integrator at the second adder, and
      an output from the second adder at the second integrator;
   receiving, at a quantizer, the output from the second integrator;
   feeding back, from a quantizer, the output to the first adder and the NCSI; and
   producing, by the quantizer, the output from the feed-forward delta-sigma modulator.

10. The method of claim 9, further comprising:
    subtracting, by the second adder, the output received through a feedback path from the quantizer.

11. The method of claim 9, wherein the output of the second integrator comprises a third-order noise-shaped analog signal.

12. The method of claim 9, further comprising:
    receiving, by the second adder in the NCSI, a second differentiation path from the input.

13. The method of claim 9, wherein a plurality of N integrators are configured between the first integrator and the NCSI, and further wherein the output of the second integrator comprises an (N+3)-order noise-shaped analog signal.

14. The method of claim 9, further comprising:
    receiving, by a third integrator, the output from the first integrator; and
    providing, by the third integrator, an output to the NCSI,
    wherein the second adder in the NCSI receives the output of the third integrator instead of the output from the first integrator and
    further wherein the output of the second integrator comprises a fourth-order noise-shaped output signal.

15. The method of claim 14, further comprising:
    receiving, by the second adder in the NCSI, a second differentiation path from the output of the third integrator.

16. The method of claim 15, further comprising:
receiving, by the second adder in the NCSI, a third differentiation path from the input.

17. A feed-forward delta-sigma modulator, comprising:
a first means for adding a feedback signal and an input signal;
a first means for integrating an output from the first adder;
a noise-coupled means for summing and integrating comprising:
    a second means for adding:
        a differentiation path from the first means for integrating,
        an output from the first means for integrating, and
        a delayed feedback path from the output of a second means for integrating, and
    the second means for integrating an output from the second means adding; and
means for quantizing the output of the second means for integrating, wherein the quantizing means:
    feeds back the output to the first means for adding and the noise-coupled means for summing and integrating, and
    produces the output from the feed-forward delta-sigma modulator.

18. The feed-forward delta-sigma modulator of claim 17, wherein the second means for adding subtracts the output received through a feedback path from the quantizing means.

19. The feed-forward delta-sigma modulator of claim 17, wherein the output of the second means for integrating comprises a third-order noise-shaped analog signal.

20. The feed-forward delta-sigma modulator of claim 17, wherein the second means for adding further adds a second differentiation path from the input signal.

* * * * *